United States Patent [19]
Fürter et al.

[11] Patent Number: 5,982,558
[45] Date of Patent: Nov. 9, 1999

[54] REMA OBJECTIVE FOR MICROLITHOGRAPHIC PROJECTION EXPOSURE SYSTEMS

[75] Inventors: Gerd Fürter, Ellwangen; Johannes Wangler, Königsbronn; Udo Dinger; Gerhard Ittner, both of Oberkochen, all of Germany

[73] Assignee: Carl-Zeiss-Stiftung, Heidenheim/Brenz, Germany

[21] Appl. No.: 08/771,654

[22] Filed: Dec. 23, 1996

[30] Foreign Application Priority Data

Dec. 27, 1995 [DE] Germany .......................... 195 48 805

[51] Int. Cl.⁶ .............................. G02B 3/00; G02B 21/02; G02B 17/00
[52] U.S. Cl. .......................... 359/649; 359/656; 359/661; 359/726
[58] Field of Search ..................................... 359/648–651, 359/656, 661, 726

[56] References Cited

U.S. PATENT DOCUMENTS

| | | | |
|---|---|---|---|
| 4,929,071 | 5/1990 | Mercado | 359/648 |
| 5,170,207 | 12/1992 | Tezuka et al. | 355/67 |
| 5,559,637 | 9/1996 | Moskovich | 359/648 |
| 5,646,715 | 7/1997 | Wangler | 355/67 |
| 5,675,401 | 10/1997 | Wangler et al. | 355/67 |
| 5,677,797 | 10/1997 | Betensky | 359/648 |
| 5,742,436 | 4/1998 | Fürter | 359/727 |
| 5,805,344 | 9/1998 | Sesaya et al. | 359/651 |

FOREIGN PATENT DOCUMENTS 0526242 2/1993 European Pat. Off. .

*Primary Examiner*—Georgia Epps
*Assistant Examiner*—Evelyn A. Lester
*Attorney, Agent, or Firm*—Walter Ottesen

[57] ABSTRACT

A REMA objective 123 images an object plane 1 onto the reticle plane 33 and has a lens group 300 disposed in the half of the objective close to the reticle. The object plane 1 lies at a finite spacing. In the lens group 300, the principal ray elevations are greater in magnitude than the elevations of the peripheral rays. A scattering surface 28 is arranged in the lens group 300 having a largest magnitude of sine of the angle of incidence of the principal ray in air with respect to the surface normal ($|\sin (i_{princ})|$) greater than 0.35 and preferably greater than 0.5.

13 Claims, 2 Drawing Sheets

REMA OBJECTIVE FOR MICROLITHOGRAPHIC PROJECTION EXPOSURE SYSTEMS

FIELD OF THE INVENTION

The invention relates to a REMA objective. This is an objective with which a REMA, that is a reticle edge masking assembly is imaged into the plane of the reticle. The reticle supports the structured mask for lithography. The region illuminated on the reticle is thereby sharply defined. Usually, the reticle masking device is assembled with adjustable edges. The imaging normally functions to enlarge. The REMA objective is utilized in microlithographic exposure systems or steppers or scanners conventionally referred to.

BACKGROUND OF THE INVENTION

U.S. Pat. No. 5,646,715 discloses an illuminating arrangement for a microlithographic projection system wherein the following elements are arranged in sequence: light source, shutter, in-coupling objective (zoom axicon), glass rod as an integrator, reticle masking system, REMA objective for imaging the intermediate field plane on the reticle. The intermediate field plane lies in the reticle masking system. The REMA objective includes a first lens group, a pupillary intermediate plane, a second lens group, a deflecting mirror, a third lens group and the reticle plane with the reticle. Thereafter, a projection objective follows which normally operates in reduction and (for example, for non-telecentric input) includes an inner-lying pupillary plane. The wafer follows in the image plane.

European patent publication 0,526,242 discloses a projection exposure apparatus including an integrator in the form of a condenser having a honeycomb structure. A projection objective follows the integrator and is located ahead of the reticle masking system. The reticle edge masking assembly is optically conjugated (that is, imaged to the plane of the reticle) via two lens groups and a mirror. At the same time, the diaphragm at the outlet of the integrator (the secondary light source) is imaged onto the pupil of the projection objective via the two lens groups and portions of the projection objective. No mention is made of imaging errors.

U.S. Pat. No. 5,742,436 discloses a very wide aperture catadioptric reducing objective lens for microlithography. The embodiment shown in FIG. 3 of this application and the structural data given in Table 2 thereof are precisely adapted to the embodiment of a REMA objective disclosed in the present application. U.S. Pat. Nos. 5,742,436 and 5,646,715 are both incorporated herein by reference. Table 2 of this application corresponds to Table 2 of U.S. Pat. No. 5,742,436.

SUMMARY OF THE INVENTION

It is an object of the invention to provide a high-quality REMA objective.

The position of the principal rays should be matched to the inlet pupil of the projection objective and be suitable for typical projection objectives. The diaphragm edges, which lie in the object plane of the REMA objective, must be imaged precisely onto the reticle plane and an exposed corrected pupillary intermediate image is sought because then, at the location of the intermediate image, further diaphragms and the like can be mounted, for example, to mask parts of an alignment system.

The above objects are achieved in accordance with the invention by introducing large angles into the beam path.

According to a feature of the invention, a lens group is provided in the reticle end half of the objective half in which the principal rays have an elevation at an amount greater than the elevation of the peripheral rays. Also, a concave surface is provided having the largest amount of the sine of the incident angle of the principal ray in air ($|\sin (i_{princ})|$) >0.35 and especially greater than 0.5. In this way, primarily the position of principal rays can be matched on the entry pupil of the projection objective.

According to another feature of the invention, the foregoing is supplemented in that, in the direction of the light rearward of the REMA objective, the reciprocal value of the principal ray intersection distance referred to the reticle for principal rays remote from the axis is less, in a mathematical sense, than for principal rays close to the axis.

According to another feature of the invention, either forward of or both forward and rearward of the intersect point of the principal rays with the optical axis (this intercept point lies in the plane of the diaphragm), at least one and preferably one of the next four optical surfaces has a surface curved toward this intersect point with a greatest amount of the sine of the incident angle of a peripheral ray in air ($|\sin (i_{per})|$) is greater than 0.8 times the numerical aperture at the object end.

According to still another feature of the invention, at least one lens surface lies between the plane of the diaphragm and a reticle (image plane of the REMA objective) on which the largest amount of the sine of the incident angle of a coma ray in air to the surface normal $|\sin (i_{coma\ max})|$ is greater than 0.8 times the input end numerical aperture NAO.

In addition, it is provided that the imaging of the object plane with the reticle masking system on the reticle plane is so good that, in the image of a bright-dark edge, the brightness values 5% and 95% do not lie apart more than 2%, (preferably 0.5%) of the image field diameter.

These measures are therefore suitable for very precisely imaging object edges and especially the edges of the reticle mask.

The diaphragm plane contains the intercept of the principal rays with the optical axis. A diverging air gap is arranged between the object plane and the diaphragm plane and is curved toward the object plane. In this way, an excellent correction of the intermediate image is ensured.

In another feature of the invention, a component objective is configured for displaying a corrected pupillary plane in the diaphragm plane of the REMA objective.

An especially good coma correction of this component objective is provided. For this purpose, at least one concave surface, which is curved toward the object plane, is provided whereat the amount of the sine of the incidence angle of a peripheral ray in air ($|\sin (i_{per})|$) is less than 0.8 times the numerical aperture of the REMA objective at the object end. The largest amount of the sine of the incident angle of a coma ray ($|\sin (i_{coma-max})|$) is greater than 0.8 times the numerical aperture of the REMA objective at the object end.

The REMA objective is preferably utilized in a microlithographic projection exposure system in which the reticle mask is mounted at the output of a glass rod. Here, the objective component is needed up to the diaphragm plane. In systems having a honeycomb condenser without a reticle masking system, only the next-following part (which has a rearward part defining a field lens) is needed. It is a special advantage of the invention that the reticle mask, which in most cases is an adjustable diaphragm, is mounted at the end of the glass rod. The diaphragm comprises precision edges and this diaphragm is precisely imaged on the reticle plane.

The REMA objective of the invention can be used with a catadioptric projection objective.

A complete projection exposure system for microlithography having the REMA objective is also provided. A glass rod is provided forward of the REMA objective and a projection objective having an entry pupil is provided downstream of the REMA objective and provides the essential function thereof, namely: to project the reticle mask precisely into the reticle plane and to cleanly match the exit pupil of the REMA objective to the entry pupil of the projection objective.

In total, the foregoing provides that the special illuminating characteristic, which is generated in an objective arranged between the light source and the glass rod, is transmitted for all points of the reticle with precision into the entry pupil of the projection objective. Such illuminating characteristic includes the conventional illumination with variable aperture, that is the coherence factor σ, annular aperture illumination, symmetrical inclined illumination and quadrupole illumination as, for example, shown in U.S. Pat. No. 5,675,401.

BRIEF DESCRIPTION OF THE DRAWINGS

The invention will now be described with reference to the drawings wherein.

DESCRIPTION OF THE PREFERRED EMBODIMENTS OF THE INVENTION

Figure 1:
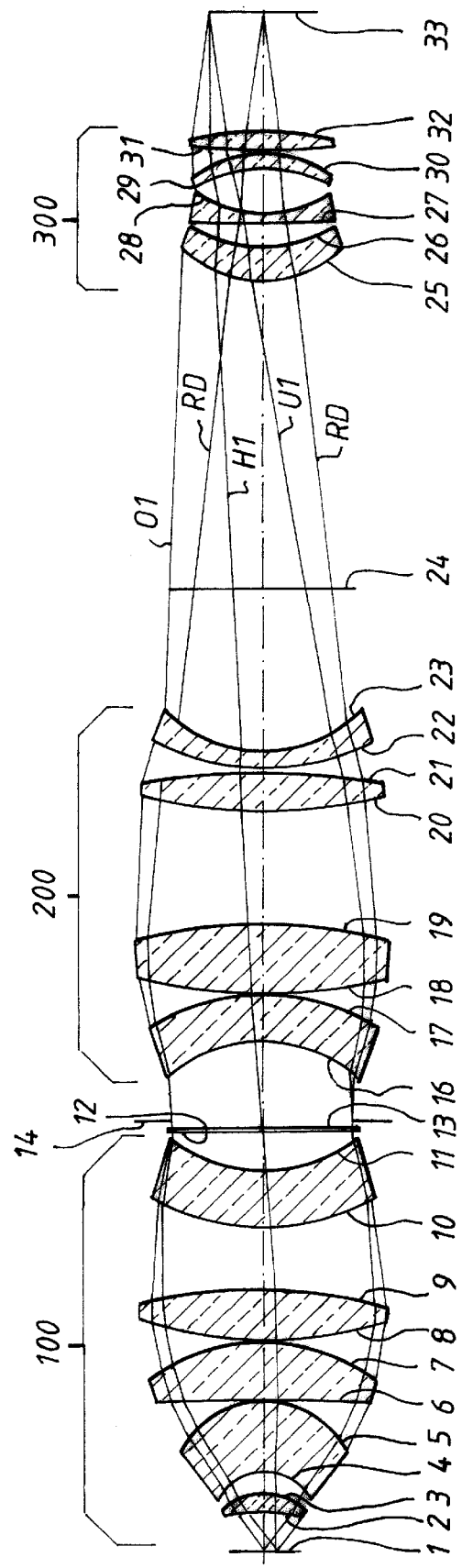
FIG. 1 is a longitudinal section view taken through the REMA objective.

The REMA objective in FIG. 1 has three lens groups 100, 200, 300. The pupillary plane 14 lies rearward of the planar plate (12, 13). Space for the installation of a deflection mirror is provided at the plane 24. The placement of the mirror in this manner is significant for a compact accommodation of the REMA objective in the exposure system. A free work space is provided between the third lens group 300 and the image plane 33 so that adequate space remains for attaching and manipulating the reticle. The principal ray H1, the peripheral rays RD and the upper coma ray O1 and the lower coma ray U1 are shown. Table 1 provides the radii and spaces of the lenses having the surfaces 2 to 32 referred to the object plane 1 and the image plane 33. All of the lenses are made of quartz glass.

Table 2 provides the data of the precisely fitting catadioptric reduction objective as disclosed in U.S. Pat. No. 5,742, 436, and incorporated herein by reference. In U.S. Pat. No. 5,742,436, the reduction objective is shown in FIG. 3 and the data therefore is provided in Table 2.

The sine of the incident angle on the surfaces is provided in Table 1 also for the peripheral rays RD, the principal ray H1, the upper coma ray O1 and the lower coma ray U1. The sines of these angles are: $\sin(i_{per})$, $\sin(i_{princ})$, $\sin(i_{coma-upper})$, $\sin(i_{coma-lower})$.

Figure 2:
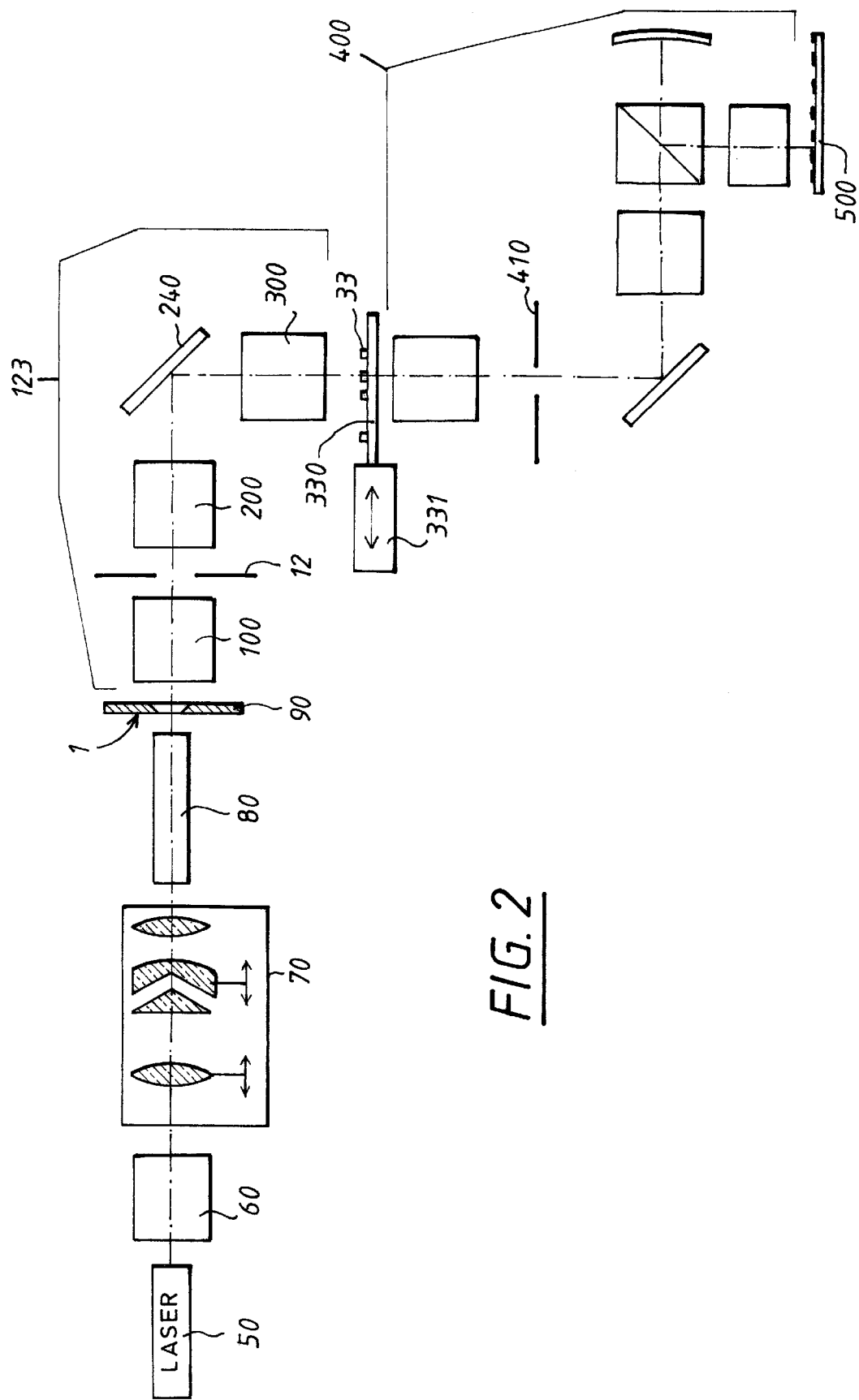
FIG. 2 is a schematic overview of a microlithographic projection exposure system incorporating the REMA objective according to the invention.

FIG. 2 is a schematic overview of the optical part of an entire projection exposure system (wafer stepper).

A KrF-excimer laser 50 having a wavelength of 248 nm functions as a light source. A device 60 functions to form the rays and provides coherence reduction. A zoom axicon objective 70 permits the required adjustment of various illuminating types. Except for the features of the REMA objective 123, the entire arrangement is disclosed in U.S. Pat. No. 5,674,401 and U.S. Pat. No. 5,646,715, both of which are incorporated herein by reference. The light is coupled into the glass rod 80 and this rod functions to mix and homogenize.

The reticle edge masking assembly (REMA) 90 immediately follows and lies in the object plane 1 of the REMA objective 123. The REMA objective 123 includes the first lens group 100, the pupillary plane (diaphragm plane) 14, the second lens group 200, the deflecting mirror 240, the third lens group 300 and the image plane 33. Here, in image plane 33, the reticle 330 is mounted which is precisely positioned by the exchange and adjusting unit 331. The catadioptric projection objective 400 follows and has the pupillary plane 410. The projection objective 400 is disclosed in U.S. Pat. No. 5,742,436. The entry pupil lies almost at infinity forward of the projection objective in the embodiment of Tables 1 and 2. The wafer 500 is mounted in the image plane.

The principal rays leave the object plane 1 of the REMA objective 123 almost perpendicularly. A diverging air space is provided between lens surfaces 3 and 4 and is curved toward the object plane 1.

The thin planar plate (12, 13) is mounted next to the pupillary plane 14 and functions to provide space for accommodating diaphragms, filters and the like as may be required. The pupil is adequately corrected for a clean further processing of these diaphragms et cetera. Accordingly, the objective part is corrected up to the pupil 14 as a component objective having an object at infinity. The diaphragm of the component objective is at the location of the object plane 1 of the REMA objective 123 and the image plane of the component objective is at the location of the diaphragm plane of the entire REMA objective. In this component objective, the coma as transverse deviations is less than 1% (preferably less than 0.2%) of the image field diameter of this component image.

The surfaces 11 and 16 satisfy the condition of one embodiment of the invention because they are curved toward the pupillary plane 14 and for the surface 11, $|\sin(i_{per})|=0.62$, for the surface 16, $|\sin(i_{per})|=0.66$. The numerical aperture at the object end is NAO=0.60 (equal to $|\sin(i_{per})|$ at the object plane 1). The numerical aperture lies preferably between 0.35 and 0.75 for variations.

In this way, the quotient $|\sin(i_{per})|$: NAO for both surfaces is greater than 1 and definitely greater than 0.8.

No more than one lens should be disposed between these surfaces having the characteristic of this embodiment and the pupillary plane.

In addition, a surface 23 lies between diaphragm plane 14 and the reticle plane 33. This surface 23 has the largest magnitude of the sine of the incident angle of a coma ray in air to the surface normal, more specifically, $|\sin(i_{coma\ max})|$ is greater than 0.8 times the input end numerical aperture NAO.

These surfaces influence advantageously the Petzval sum and the spherical aberration.

In the third lens group 300, the principal ray heights are greater than the peripheral ray heights and the surface 28 is diverging $|\sin(i_{princ})|$ is 0.54, that is, greater than 0.5. The third lens group 300 lies correspondingly close to the reticle plane 33.

This third lens group 300 has a positive focal length and functions to adapt the principal rays of the REMA objective 123 to the principal rays of the projection objective 400. In each illuminated point of the reticle plane 33, the centroidal ray of the incident light cone differs only little from the pregiven principal ray of the next-following projection objective 400. Provision is made that the angle deviation lies below 3 milliradians. This deviation is under 1 milliradian in the embodiment of Table 1 in combination with the projection objective 400 of Table 2.

The intensely diverging surface 28 is especially useful for this principal ray adaptation. For this surface, $|\sin(i_{princ})|$= 0.54. The value therefore corresponds to the requirement of the first embodiment of the invention. This large i angle makes it possible to adapt the principal ray H1 to the entry pupil 410 of the projection objective 400.

The distortion of the REMA objective 123 is corrected to less than 0.5%. Less than 3% or less than 0.5% are generally distortions which are targeted. For this purpose, a curved collecting surface is advantageously provided in the third lens group 300 and for this surface, the following applies: $|\sin(i_{princ})| \geq 0.35$. This is the surface 25 having: $|\sin(i_{princ})| = 0.47$.

The REMA objective of the invention and especially the embodiment shown is in practice especially well suited to provide free space in the regions of the object and image planes and the pupil.

The total structural length of elements 1 to 33 is 1200 mm and can be approximately 500 to 2000 mm depending upon the particular configuration. The free space between the object plane 1 and the first objective surface 2 is approximately 30 mm. At least approximately 5 mm are generally sought so that the variable reticle masking diaphragm 90 can be well accommodated in the object plane 1.

A free space of over 60 mm is provided after the planar plate (12, 13) mounted next to the pupillary plane 14. In this way, an exchange device for planar plates (12, 13) having different filter and diaphragm effects can be mounted.

A free space is provided between the second lens group 200 and the third lens group 300. This free space is significantly longer than the cross section of the light tube so that a deflecting mirror 240 can be mounted in the region of the plane 24 and can also be displaced relative to this plane (see FIG. 2).

The free distance (32 to 33) of the objective to the reticle plane is over 90 mm (7.5% of the structural length) and is adequately dimensioned. For all variations, more than 3% of the structural length is targeted in order to hold the reticle 330 including the exchange and adjusting device 331 with sufficient space.

The object end principal ray is preferably perpendicular to the object plane 1 in the embodiment shown.

The object plane 1 can be coincident with the exit surface of the glass rod 80. However, a small distance to the glass rod 80 is needed to accommodate a variable object field plane (the REMA 90). This distance to the glass rod 80 is, however, less than 0.8% of the structural length of the REMA objective 123.

The REMA objective 123 images the object plane 1 in the scale $\beta = -4.444$ in the example and generally images the object plane at a magnification of at least twice, and as a rule, 3 to 8 times.

On the one hand, this is caused by the fact that the image field diameter in the reticle plane 33 must be as large as the object field diameter of the projection objective 400. For an image field diameter on the wafer 500 of 30 mm, the image field diameter of the REMA objective must be 120 mm or 150 mm for a 4 to 5 time reducing projection objective 400.

The diameter of the glass rod 80 is, however, significantly less so that a high magnification is needed. In a honeycomb condenser (also known as fly-eye lens), the diameter is, however, generally significantly greater than for a glass rod so that a magnification of this kind is then not necessary.

The first lens group 100 is configured as a component objective. The object plane of lens group 100 lies at infinity and the diaphragm lies at the location of the object plane 1 of the entire REMA objective 123. The peripheral rays of the component objective correspond to telecentric principal rays of the REMA objective 123; whereas, the principal rays of the component objective correspond to the peripheral rays of the REMA objective 123. The image plane of the component objective then lies in the region of the diaphragm plane 14 of the REMA objective 123. The imaging quality of this component image is such that the maximum value of the coma as a transverse deviation is less than 1% and is preferably less than 0.2% of the image field diameter of this component image. In the embodiment, this value is less than 0.2%.

For this coma correction, at least one curved concave surface is arranged in the component objective 100 facing toward the object plane 1 and, for this surface, the following applies: $|\sin(i_{per})| \leq 0.8 \cdot NAO$ (objective end numerical aperture of the REMA objective 123) for the peripheral ray angle and $|\sin(i_{coma\ max})| \geq 0.8 \cdot NAO$ for the largest occurring coma ray angle in the component objective 100. In the embodiment shown, this condition is satisfied by the surface 4 having: $|\sin(i_{per})| = 0.43$ and $|\sin(i_{coma\ max})| = 0.65$ (NAO= 0.6).

The REMA objective can be achromatized, for example, by configuring the bent menisci 10, 11 and 16, 17 in proximity to the diaphragm as composite elements.

The embodiment shown is provided for ultraviolet light at 248 nm wavelength. Lower wavelengths (such as 193 nm) as well as higher wavelengths (such as i line at 365 nm) are possible with minimum adaptation of this embodiment.

The REMA objective can be used in a microlithgraphic projection exposure system wherein the reticle mask 90 can be mounted at the output of the glass rod 80.

The REMA objective can be used in a microlithgraphic projection exposure system wherein the projection objective 400 is a demagnifying catadioptric objective.

It is understood that the foregoing description is that of the preferred embodiments of the invention and that various changes and modifications may be made thereto without departing from the spirit and scope of the invention as defined in the appended claims.

TABLE 1

Wavelength $\lambda$ = 248.38 nm
Imaging Scale $\beta$ -4.44
Numerical Aperture = 0.6

| Nr. | Radius | Thickness | Glass | RD | 01 | H1 | U1 |
|---|---|---|---|---|---|---|---|
| 1 | Planar | 30.72 | | .60 | .60 | .00 | -.60 |
| 2 | -86.28 | 13.81 | Quartz | .38 | .47 | .11 | -.29 |
| 3 | -44.80 | 18.11 | | -.15 | .07 | .28 | .38 |
| 4 | -39.93 | 55.00 | Quartz | -.43 | -.19 | .28 | .65 |
| 5 | -76.61 | 1.0 | | -.43 | -.29 | .16 | .56 |
| 6 | -1047.19 | 43.85 | Quartz | .37 | .39 | .03 | -.36 |
| 7 | -153.10 | 2.00 | | -.35 | -.25 | .11 | .45 |
| 8 | 326.10 | 38.48 | Quartz | .45 | .46 | .01 | -.44 |
| 9 | -396.62 | 43.07 | | -.29 | -.20 | .10 | .38 |
| 10 | 164.06 | 45.00 | Quartz | .44 | .48 | .04 | -.40 |
| 11 | 117.72 | 28.67 | | .62 | .67 | .05 | -.56 |
| 12 | Planar | 1.50 | Quartz | .01 | .09 | .08 | .06 |
| 13 | Planar | 2.00 | | | | | |

TABLE 1-continued

Wavelength λ = 248.38 nm
Imaging Scale β −4.44
Numerical Aperture = 0.6

| Nr. | Radius | Thickness | Glass | RD | O1 | H1 | U1 |
|---|---|---|---|---|---|---|---|
| 14 | Diaphragm | 67.45 | | | | | |
| 16 | −108.16 | 37.23 | Quartz | −.66 | −.62 | .03 | .69 |
| 17 | −165.92 | 1.06 | | −.38 | −.34 | .03 | .41 |
| 18 | 494.18 | 55.65 | Quartz | .32 | .41 | .10 | −.24 |
| 19 | −345.37 | 36.53 | | −.34 | −.33 | .02 | .36 |
| 20 | 369.96 | 30.69 | Quartz | .13 | .22 | .10 | −.04 |
| 21 | −685.05 | 2.57 | | −.37 | −.38 | −.00 | .36 |
| 22 | 183.76 | 12.67 | Quartz | .14 | .23 | .11 | −.05 |
| 23 | 107.14 | 127.91 | | .52 | .70 | .21 | −.34 |
| 24 | Planar | 239.33 | | −.12 | −.04 | .05 | .17 |
| 25 | 87.96 | 27.87 | Quartz | .17 | .69 | .47 | .27 |
| 26 | 111.57 | 16.73 | | .02 | .32 | .29 | .27 |
| 27 | 744.34 | 8.60 | Quartz | −.15 | −.14 | .03 | .19 |
| 28 | 87.96 | 35.54 | | .11 | .69 | .54 | .41 |
| 29 | −105.49 | 11.35 | Quartz | −.22 | −.40 | −.18 | .04 |
| 30 | −89.35 | 1.31 | | −.25 | −.59 | −.33 | −.07 |
| 31 | 403.64 | 14.72 | Quartz | −.06 | .17 | .22 | .28 |
| 32 | −313.72 | 94.55 | | −.18 | −.30 | −.13 | −.05 |
| 33 | Planar | | | −.13 | −.13 | .00 | .14 |

TABLE 2

Wavelength λ = 248.38 nm
Imaging Scale β −4.44
Numerical Aperture NA = 0.70
Glass: Quartz n = 1.50834

| Nr. | Radius | Thickness | Glass |
|---|---|---|---|
| 1 | −208.30 | 46.25 | |
| 2 | −498.48 | 11.38 | Quartz |
| 3 | 368.29 | 1.00 | |
| 4 | −173.64 | 16.30 | Quartz |
| 5 | Planar | | |
| 6 | −127.78 | 66.00 | |
| 7 | 251.15 | 9.70 | Quartz |
| 8 | 1891.95 | 79.28 | |
| 9 | −160.51 | 38.73 | Quartz |
| 10 | −2818.18 | 1.03 | |
| 11 | 263.13 | 15.49 | Quartz |
| 12 | 997.93 | 13.96 | |
| 13 | −273.97 | 29.30 | Quartz |
| 14 | Planar | 1.00 | |
| 15 | Planar | 95.50 | Quartz |
| 16 | Planar | 95.50 | Quartz |
| 17 | −245.27 | 21.10 | |
| 18 | 3216.71 | 15.63 | Quartz |
| 19 | −437.42 | 15.16 | Mirror |
| 20 | −3216.71 | 15.16 | |
| 21 | 245.27 | 15.63 | Quartz |
| 22 | Planar | 21.10 | |
| 23 | Planar | 191.0 | Quartz |
| 24 | 278.04 | 1.00 | |
| 25 | 4615.58 | 24.57 | Quartz |
| 26 | 262.26 | 63.39 | |
| 27 | −620.91 | 40.81 | Quartz |
| 28 | 208.55 | 1.08 | |
| 29 | −2336.21 | 24.75 | Quartz |
| 30 | −441.28 | 6.67 | |
| 31 | 1144.28 | 15.29 | Quartz |
| 32 | 71.95 | 1.06 | |
| 33 | 50.36 | 36.07 | Quartz |
| 34 | 60.47 | 13.64 | |
| 35 | 3672.41 | 53.85 | Quartz |
| 36 | | 6.34 | Image (Wafer) |

What is claimed is:

1. A REMA objective defining an object plane at a finite distance therefrom and a reticle plane for accommodating a reticle and the REMA objective being adapted to image the object plane into the reticle plane, the REMA objective comprising:

a plurality of lens groups defining an optical axis and through which principal and peripheral rays pass in a direction of light from the object plane to the reticle plane;

one of said lens groups being arranged in a reticle side half of the REMA objective and wherein said principal ray is at an elevation greater than said peripheral ray measured from said optical axis;

said one lens group including a lens defining a concave surface upon which said principal ray impinges in air at an incident angle; and, said concave surface having a magnitude of the sine of said incident angle in air relative to the surface normal ($|\sin(i_{princ})|$) at least greater than 0.35.

2. REMA objective of claim 1, wherein: in the direction of light rearward of said REMA objective, the reciprocal value of a principal ray intersection distance referred to the reticle plane for said principal rays remote from said axis is less, in a mathematical sense, than for principal rays close to said axis.

3. A REMA objective defining an object plane at a finite distance therefrom and a reticle plane for accommodating a reticle and the REMA objective being adapted to image the object plane into the reticle plane, the REMA objective comprising:

a plurality of lens groups defining an optical axis and through which principal and peripheral rays pass in a direction of light from the object plane to the reticle plane; and, either forward of or both rearward and forward of an intersect point of said principal ray with said optical axis, at least one optical surface is formed as a surface curved toward said intersect point with a greatest amount of the sine of the incident angle of a peripheral ray in air ($|\sin (i_{per})|$) is greater than 0.8 times the numerical aperture at said object plane.

4. The REMA objective of claim 3, said lens groups including first, second and third lens groups arranged one behind the other along said optical axis and said one lens group being said third lens group; and, the REMA objective further defining a diaphragm plane between said first and second lens groups and including at least one lens surface between said diaphragm plane and said reticle plane on which the largest amount of the sine of the incident angle of a coma ray in air to the surface normal $|\sin (i_{coma\ max})|$ is greater than 0.8 times the input end numerical aperture NAO.

5. The REMA objective of claim 4, wherein: an image of a bright-dark edge of the object plane on the reticle plane results in a trace of said edge having its brightness value of 5% and 95% not lying apart more than 2% of the image field diameter.

6. A REMA objective defining an object plane at a finite distance therefrom and a reticle plane for accommodating a reticle and the REMA objective being adapted to image the object plane into the reticle plane, the REMA objective comprising:

a plurality of lens groups defining an optical axis and through which principal and peripheral rays pass in a direction of light from the object plane to the reticle plane;

the REMA objective defining a diaphragm plane between two of said lens groups and said diaphragm plane containing an intercept of the principal ray with said optical axis; and, a diverging air gap arranged between said object plane and said diaphragm plane and said diverging air gap being curved toward said object plane.

7. The REMA objective of claim 4, wherein said first component lens group is configured to display a corrected pupillary plane in said diaphragm plane.

8. The REMA objective of claim 6, wherein at least one concave surface, which is curved toward said object plane, is provided whereat the amount of the sine of the incidence angle of a peripheral ray in air ($|\sin(i_{per})|$) is less than 0.8 times the numerical aperture of said REMA objective at said object plane; and the largest amount of the sine of the incident angle of a coma ray ($|\sin(i_{coma-max})|$) is greater than 0.8 times the numerical aperture of said REMA objective at said object plane.

9. A projection exposure system for microlithography comprising:

an illuminating system including a light sources, a glass rod and a reticle edge masking assembly (REMA) defining an optical axis;

a projection objective having a pupillary plane and being arranged on said optical axis downstream of said glass rod;

a REMA objective interposed between said illuminating system and said projection system and having a pupillary plane imaged into said pupillary plane of said projection objective;

said REMA objective defining an object plane at a finite distance therefrom and a reticle plane for accommodating a reticle and the REMA objective being adapted to image the object plane into the reticle plane; and, said REMA objective including:

first, second and third lens groups arranged on said optical axis and through which principal and peripheral rays pass; said third lens group being arranged in a reticle side half of the REMA objective and wherein said principal ray is at an elevation greater than said peripheral ray measured from said optical axis; said third lens group including a lens defining a concave surface upon which said principal ray impinges in air at an incident angle; said concave surface having a magnitude of the sine of said incident angle in air relative to the surface normal ($|\sin(i_{princ})|$) at least greater than 0.35; and, said first lens group being configured to generate said pupillary plane of said REMA objective as a corrected pupillary plane.

10. A projection exposure system for microlithography comprising:

an illuminating system including a light source, a glass rod and a reticle edge masking assembly (REMA) defining an optical axis;

a projection objective having a pupillary plane and being arranged on said optical axis downstream of said glass rod;

a REMA objective interposed between said illuminating system and said projection system and having a pupillary plane imaged into said pupillary plane of said projection objective;

said REMA objective defining an object plane at a finite distance therefrom and a reticle plane for accommodating a reticle and the REMA objective being adapted to image the object plane into the reticle plane; and, said REMA objective including:

a plurality of lens groups arranged on said optical axis and through which a principal ray and a peripheral ray pass; and, either forward of or both rearward and forward of an intersect point of said principal ray with said optical axis, at least one optical surface of a lens of one of said lens groups is formed as a surface curved toward said intersect point with a greatest amount of the sine of the incident angle of a peripheral ray in air ($|\sin(i_{per})|$) is greater than 0.8 times the numerical aperture at said object plane.

11. A projection exposure system for microlithography comprising:

an illuminating system including a light source, a glass rod and a reticle edge masking assembly (REMA) defining an optical axis;

a projection objective having a pupillary plane and being arranged on said optical axis downstream of said glass rod;

a REMA objective interposed between said illuminating system and said projection system and having a pupillary plane imaged into said pupillary plane of said projection objective;

said REMA objective defining an object plane at a finite distance therefrom and a reticle plane for accommodating a reticle and the REMA objective being adapted to image the object plane into the reticle plane; and, said REMA objective including:

a plurality of lens groups arranged on said optical axis and through which principal and peripheral rays pass;

said REMA objective defining a diaphragm plane between two of said lens groups and said diaphragm plane containing an intercept of the principal ray with said optical axis; and, a diverging air gap arranged between said object plane and said diaphragm plane and said diverging air gap being curved toward said object plane.

12. The REMA objective of claim 1, wherein: the REMA objective has a distortion, the distortion being less than 3%.

13. The REMA objective of claim 12, wherein: a lens group is arranged in a reticle half side of the REMA objective, a curved collecting surface is provided in said lens group and for this surface, the following applies: ($|\sin(i_{princ})|$) $\geq 0.35$.

* * * * *